US006362063B1

(12) United States Patent
Maszara et al.

(10) Patent No.: US 6,362,063 B1
(45) Date of Patent: Mar. 26, 2002

(54) FORMATION OF LOW THERMAL BUDGET SHALLOW ABRUPT JUNCTIONS FOR SEMICONDUCTOR DEVICES

(75) Inventors: Witold P. Maszara, Sunnyvale; Srinath Krishnan, Campbell; Shekhar Pramanick, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/226,773

(22) Filed: Jan. 6, 1999

(51) Int. Cl.[7] ...................... H01L 21/336; H01L 21/425

(52) U.S. Cl. ........................ 438/307; 438/528; 438/301

(58) Field of Search ................................ 438/528, 307, 438/301

(56) References Cited

U.S. PATENT DOCUMENTS

| | | | | |
|---|---|---|---|---|
| 4,617,066 A | | 10/1986 | Vasudev | 148/1.5 |
| 4,683,645 A | | 8/1987 | Naguib et al. | 437/41 |
| 4,837,173 A | * | 6/1989 | Alvis et al. | |
| 5,168,072 A | | 12/1992 | Moslehi | 437/41 |
| 5,254,484 A | | 10/1993 | Hefner et al. | 437/24 |
| 5,320,974 A | * | 6/1994 | Hori et al. | |
| 5,397,909 A | | 3/1995 | Moslehi | 257/383 |
| 5,607,511 A | | 3/1997 | Meyerson | 118/725 |
| 5,789,310 A | | 8/1998 | Pramanick et al. | 438/528 |
| 5,885,886 A | * | 3/1999 | Lee | |
| 5,899,732 A | * | 5/1999 | Gardner et al. | |
| 5,998,272 A | * | 12/1999 | Ishida et al. | |
| 6,008,098 A | * | 12/1999 | Pramanick et al. | |

OTHER PUBLICATIONS

S.N. Hong, et al., "Material and Electrical Properties of Ultra–Shallow p+–n Junctions Formed by Low–Energy Ion Implantation and Rapid Thermal Annealing", IEEE Transactions On Electron Devices, vol. 38, No. 3, Mar. 1991, pp. 476–486.

M.Y. Tsai et al., "Recrystallization of Implanted Amorphous Silicon Layers. I. Electrical Properties of Silicon Implanted with $BF^{+2}$ or $Si^{+}+B^{+a}$)", J.Appl. Phys. 50(1), Jan. 1979, 1979 American Institute of Physics, pp. 183–187.

M.Y. Tsai et al., "Recrystallization of Implanted Amorphous Silicon Layers. II. Migration of Fluorine in $BF^{+2}$–Implanted Silicon$^{a}$)", J.Appl. Phys. 50(1), Jan. 1979, 1979 American Institute of Physics, pp. 188–192.

S. Wolf, et al., "Ion Implantation for VLSI", *Silicon Processing for the VLSI ERA vol. 1: Process Technology,* Lattice Press, pp. 303–308.

* cited by examiner

*Primary Examiner*—John F. Niebling
*Assistant Examiner*—Ron E. Pompey
(74) *Attorney, Agent, or Firm*—Skjerven Morrill MacPherson LLP; Edward C. Kwok; Michael J. Halbert

(57) ABSTRACT

A shallow abrupt junction is formed in a single crystal substrate, for example, to form a pn junction in a diode or a source drain extension in a transistor. An amorphous layer is formed at the surface of the substrate by implanting an electrically inactive ion, such as germanium or silicon, into the substrate. The amorphous/crystalline interface between the amorphous layer and the base crystal substrate is located at the depth of the desired junction. A dopant species, such as boron, phosphorus or arsenic is implanted into the substrate so that peak concentration of the dopant is at least partially within the amorphous layer. The amorphous layer can be formed either before or after the implanting of the dopant species. A low temperature anneal is used to recrystallize the amorphous layer through solid phase epitaxy, which also activates the dopant within the amorphous layer. The dopant located beneath the original amorphous/crystalline interface remains inactive. Thus, an abrupt junction is formed at the depth of the original amorphous/crystalline interface. Formation of such a shallow abrupt junction is useful in devices such as diodes and transistors, including bipolar, MOSFET and CMOS, and may be used to form source drain extensions and halo regions. Subsequent processing of the substrate has a thermal budget that is approximately equal to or less than the temperature used for the low temperature anneal.

12 Claims, 4 Drawing Sheets

314 310 306 314 310 308 314 p p 312 304 n 304 302

308 314 306 314 316 316 314 312 318 312 304 n 302 304

314 314 306 308 314 p p p p 312 320 312 304 n 302 304

FORMATION OF LOW THERMAL BUDGET SHALLOW ABRUPT JUNCTIONS FOR SEMICONDUCTOR DEVICES

FIELD OF THE INVENTION

The present invention relates to semiconductor devices, and in particular the present invention relates to the formation of shallow abrupt junctions in semiconductor devices.

BACKGROUND

Since the advent of semiconductor devices, the minimum feature size has continuously decreased. In order to further decrease the minimum feature size of semiconductor devices, which are already in the submicron realm, it is important to not only reduce the horizontal dimensions of the devices, but to also reduce the vertical dimensions, i.e., junction depth.

One known method to form shallow junctions is implanting dopant ions, such as boron, phosphorous, or arsenic into an amorphous region in a silicon substrate. A subsequent high temperature rapid thermal anneal, e.g., 1100° C. for 1 second, is then used to activate the dopant while minimizing dopant redistribution.

The high temperature anneal activates all or nearly all the dopant. Thus, the depth of the junction is a function of the depth that the dopant is implanted into the substrate, which is controlled by the energy of the implant. Consequently, it is important to use a low energy implant to maintain a shallow junction in conventionally formed devices. Unfortunately, current implanters are somewhat limited on the minimum implant energy available, and thus the depth of junctions is correspondingly limited. Because of the limits on the minimum energy available to implanters, it is particularly difficult to implant light elements, such as boron, to shallow depths. Moreover, the subsequent high temperature anneal causes further diffusion of the dopant atoms further deepening the junction.

Accordingly, there is a need for a shallow abrupt junction and a process of forming such a junction without requiring a corresponding decrease in the minimum energy produced by implanters.

SUMMARY

The present invention provides a shallow abrupt junction formed in a single crystal substrate and a process for its preparation. A single crystal substrate is implanted with a heavy inert species, such as germanium or silicon, to form an amorphous layer at the surface of the substrate. A dopant species having a first conductivity type, such as n-type dopant, is also implanted into the substrate so that there is a high concentration of the dopant species near the surface of the substrate. A low temperature anneal, at approximately 600° C., regrows the amorphous layer through solid phase epitaxy, which also activates the dopant species that is within the amorphous layer. The majority of any dopant species that was implanted deeper than amorphous layer is left unactivated. Thus, an abrupt junction is formed, which has a depth that is controlled by the depth of the original amorphous layer. Where the substrate has a background concentration of a dopant of a second conductivity type, such as p-type dopant, comparable to that of the implanted first conductivity type specie an abrupt pn junction is formed. Subsequent thermal processing at temperatures greater than the temperature used in the anneal will deactivate some of the dopant species and cause the dopant species to diffuse. Consequently, subsequent processing of the substrate has a thermal budget that is approximately equal to or less than the temperature used to regrow the amorphous layer.

The dopant species may be implanted to a depth that is greater than the depth of the amorphous layer. However, because only a partial activation of the dopant occurs, i.e., any dopant that is outside the amorphous layer is not activated, the depth of the junction can be shallow. The junction depth is advantageously not controlled strictly by the energy of the dopant implant, but rather is determined by the depth of the amorphous region implant. This is particularly advantageous because it is easier to control the depth of the implant of heavy ions, such as germanium, than light ions, such as boron. Moreover, because only a partial activation of the dopant occurs, by placing a high concentration of the implant within the amorphous regions, a steep dopant profile will result after the low temperature anneal.

Partial or full activation of an implanted dopant profile (depth wise rather than percentage of dopant at a given depth), without dopant diffusion, is advantageous because it provides a shallow junction that is otherwise unavailable through standard implantation and activation arrangements. In particular this is practical for boron dopants because inert species, such as silicon and germanium, that are heavier than boron can form an amorphous surface layer that is more shallow than the depth of the boron profile obtained at the minimum implantation energy available.

The formation of the shallow abrupt junction may be used advantageously in the formation of source and drain extensions, as well as any other desirably shallow junctions, such as an emitter junction in a bipolar transistor or diode.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 1A:
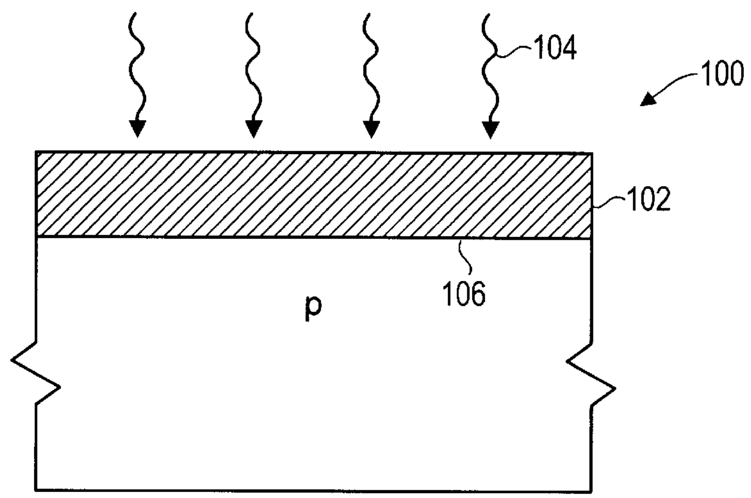
FIGS. 1A, 1B, and 1C show the processing steps of forming an abrupt shallow pn junction with a steep dopant profile.
Figure 1B:
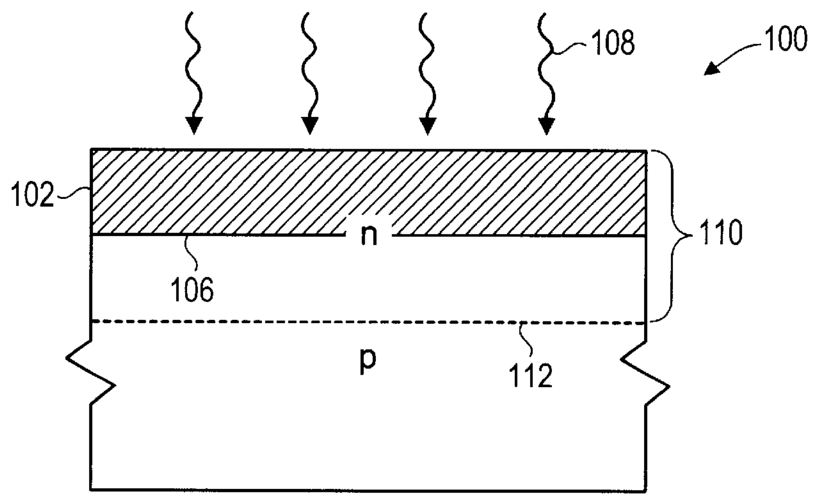
Figure 1C:
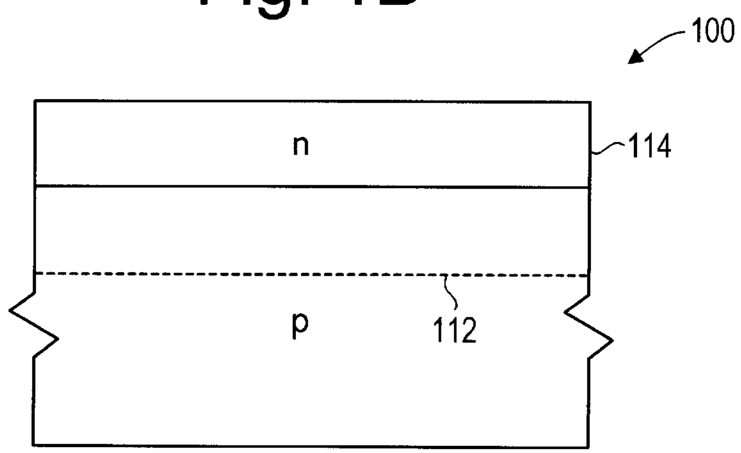

FIGS. 1A, 1B, and 1C show the processing steps of forming an abrupt shallow pn junction with a steep dopant profile. A single crystal substrate 100, such as a silicon crystal, is shown in FIG. 1A. Substrate 100 has been implanted with a dopant species of a first conductivity type, e.g., p-type. Of course, if desired an n-type dopant species may be implanted into substrate 100. The dopant species of a first conductivity type produces a background doping of substrate 100.

An amorphous layer 102 is formed in substrate 100 by implanting heavy ions 104 of an electrically inactive species such as silicon, or germanium. The use of germanium ions is particularly advantageous because the germanium ions are heavier than the other ions, and thus the amorphous/crystalline (A/C) interface 106 between amorphous layer 102 and the remaining crystalline substrate 100 is more abrupt when germanium is used then when lighter ions are used.

The A/C interface 106 is generated at approximately the same depth as the desired pn junction to be formed as is well understood by those of ordinary skill. The depth of the amorphous layer 102 is a function of the dose and energy of ions 104. While the depth of the pn junction will depend on the particular operation and type of device desired, an example of the implantation energies for germanium ions may be in range from 1–150 keV with ion doses of approximately $10^{14}$ $cm^{-2}$ to $10^{15}$ $cm^{-2}$. An energy of 30 keV with a germanium ion dose of $3\times10^{14}$ $cm^{-2}$, for example, will produce amorphous layer 102 with a depth of approximately 50 nm (nanometers). Where lighter ions are used, the dose will necessarily be increased. The depth of the pn junction, which is controlled by the depth of amorphous layer 102, will depend on the desired application, and be approximately equal to or less than 50 nm below the surface of substrate 100. The specific doses and energies of ions 104 required to generate amorphous layer 102 at any depth is well known and understood by those of ordinary skill in the art. A standard ion implanter may be used to implant ions 104 to the desired depth and concentration to generate amorphous layer 102. The amorphizing ion implantation is conducted at ambient or reduced temperatures, and is preferably conducted at 25° C.

Dopant species ions 108 having a second conductivity type, e.g., n-type, are then implanted into substrate 100 forming an inactive doped region 110, as shown in FIG. 1B. The ions 108 implanted into substrate 100 may be, for example, arsenic or phosphorous. It should be understood that the use of n-type dopant specie in region 110 is shown for illustrative purposes and that a p-type dopant specie, for example, boron or $BF_2$, may be implanted into region 110 if desired. Nevertheless, it is desirable to implant dopant species of opposite conductivities into the base substrate 100 and into region 110 so as to form a pn junction.

The desired dopant profile is a function of the dosage and implantation energy of ions 108 as will be well understood by those of ordinary skill in the art. The dopant profile preferably has a maximum concentration that is less than or equal to 50 nm from the surface of substrate 100. Dotted line 112 shows the depth of the dopant profile for implanted dopant species ions 108. Thus, region 110 contains inactive implanted ions 108 of the desired dopant specie. The physical dopant profile and active dopant profile are discussed below in reference to FIG. 2A and 2B. Techniques for implanting a dopant species to a desired depth and concentration are well known to those of ordinary skill in the art.

As illustrated in FIG. 1B, the dopant profile of region 110 need not be contained entirely within amorphous layer 102. Thus, region 110 may have a greater depth than amorphous layer 102. It is desirable, however, for the implanted dopant species to have a concentration greater than the background doping of substrate 100 between the surface of substrate 100 and the A/C interface 106.

Conventionally, the amorphous layer is used to inhibit channeling of the implanted dopant species, which requires a relatively deep amorphous layer.

However, in accordance with an embodiment of the present invention, the depth of the amorphous layer 102 is used to define the pn junction. This is advantageous because it is easier to control the depth of the implant of heavier ions, such as germanium, than lighter ions, such as boron. Further, the process steps of implanting the inert species and the dopant species of a second conductivity may be performed in any desired order, i.e., dopant species ions 108 are implanted first followed by the implantation of the inert species ions 104.

The implantation of inert species ions 104 and the dopant species ions 108 are followed by a low temperature anneal in a nitrogen atmosphere. The temperature of the annealing should be sufficient to recrystallize amorphous layer 102 through solid-phase epitaxial growth of substrate 100, but low enough to prevent the activation of the implanted dopant species outside of the amorphous layer 102, i.e., between A/C interface 106 and the dotted line 112 shown in FIG. 1B. Advantageously, activation of the implanted dopant species that is present within amorphous layer 102 occurs during the low temperature annealing process because the dopant atoms can enter substitional lattice sites in silicon substrate 100. The annealing temperature used to recrystallize amorphous layer 102 may range from 550° C. to 650° C., and is preferably approximately 600° C. The time duration of the annealing process is dependent on the depth of amorphous layer 102. Typically, a 600° C. anneal will recrystallize an amorphous layer at approximately 10 Å per second, and thus a 50 nm amorphous layer will recrystallize in 50 seconds. For more discussion of the recrystallization of an implanted amorphous region see the article entitled "Recrystallization of Implanted Amorphous Silicon Layer. I. Electrical Properties of Silicon Implanted with $BF_2^+$ or $Si^+$+$B^+$," by M. Y. Tsai and B. G. Streetman, J. Appl. Phys. 50 (1), January 1979, pp. 183–187, which is incorporated herein by reference.

FIG. 1C shows substrate 100 after the low temperature anneal. The original amorphous layer 102, shown in FIG. 1B, is recrystallized leaving a doped region 114 having the second conductivity type, e.g., n-type. The n doped region 114 has a depth that is approximately the same as the depth of the original amorphous layer 102 because during the low temperature annealing process the implanted dopant species only within amorphous layer 102 were activated. Because the implanted n-type dopant species outside amorphous layer 102 was not activated, the background p-type doping remains greater than the implanted n-type doping. Thus, a shallow abrupt pn junction is formed within substrate 100. It should be understood that n doped region 114 is the region of activated n-type dopant. There may be a region between n doped region 114 and dotted line 112 of primarily unactivated n-type dopant. However, any activated n-type dopant between n doped region 114 and dotted line 112 is preferably below the concentration level of the background dopant and thus does not affect the junction quality.

With the shallow abrupt pn junction as described above, no further annealing is necessary. Additional annealing at higher temperatures, e.g., 700° C. to 900° C., will deactivate some of the dopant species within region 114, particularly near the peak of the concentration, will diffuse the dopant deeper thereby making the junction deeper. Conventionally, an additional thermal annealing step is performed at a high temperature, for example 1000° C. to 1100° C., to further activate the implanted dopant species. However, use of a rapid thermal annealing step increases the activation and diffusion of the dopant species outside the peak of its concentration resulting in a reduction of the abruptness of the active dopant profile and junction quality, including depth and/or sheet resistance. Consequently, subsequent processing steps of substrate 100 are performed at a strictly controlled thermal budget that is approximately equal to or below the temperature used in the low temperature annealing process.

Figure 2A:
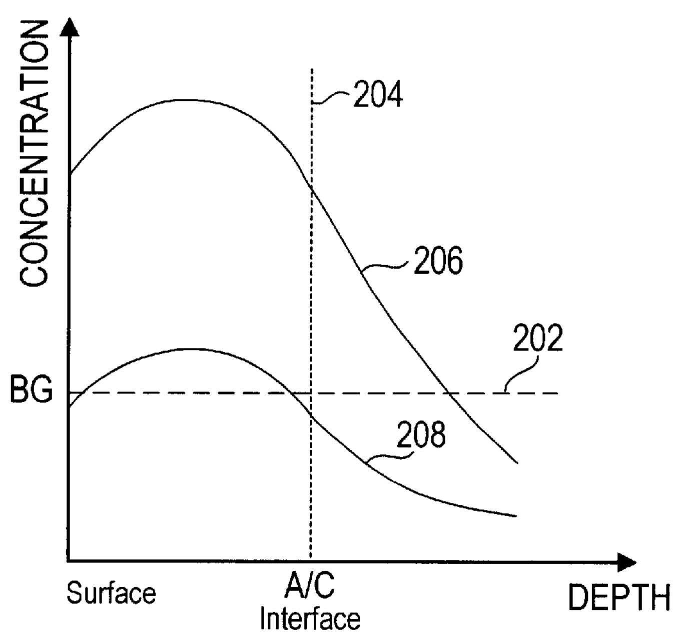
FIGS. 2A and 2B are graphs showing the dopant profiles in a substrate before and after the low temperature anneal, respectively.
Figure 2B:
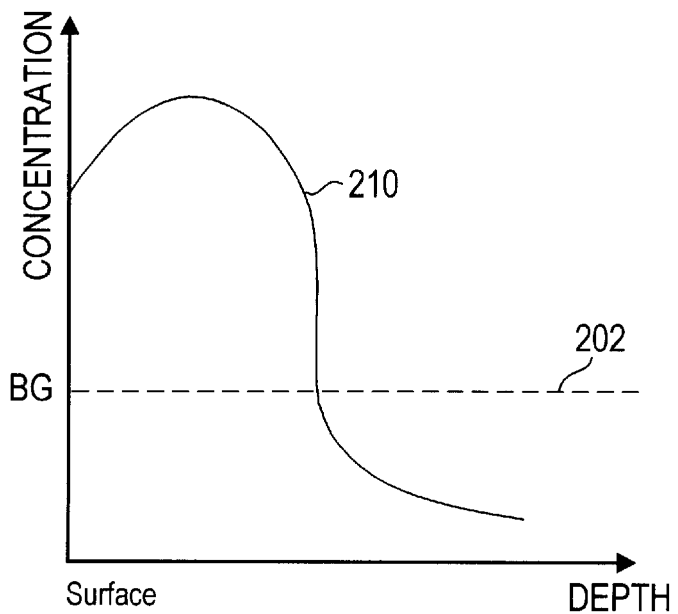

FIGS. 2A and 2B are graphs showing the dopant profiles in substrate 100 before and after the low temperature anneal, respectively, where the Y axes represent the dopant concentration and the X axes represent depth, with the surface of substrate 100 to the left of the X axes. FIGS. 2A and 2B show the background concentration as line 202 and FIG. 2A shows the A/C interface as line 204. To the left of A/C interface 204 is amorphous layer 102, shown in FIGS. 1A and 1B, and to the right of A/C interface 204 is the remaining crystalline structure of substrate 100, shown in FIGS. 1A and 1B. The physical dopant profile is shown in FIG. 2A as curve 206 and the active dopant profile is shown as curve 208. As shown in FIG. 2A, the background concentration 202 is preferably greater than the active dopant profile 208 in the crystalline structure of substrate 100, i.e., below the AC interface 204.

FIG. 2B shows the active dopant profile 210 after the low temperature anneal. Because the low temperature anneal activates the dopant species located within amorphous layer 102, shown in FIGS. 1A and 1B, but does not activate the dopant species below the A/C interface 204, the active dopant profile will change to the steep profile shown in FIG. 2B. As illustrated in FIG. 2B, the active dopant profile 210 has a high concentration near the surface of substrate 100 with a sharp drop in the active dopant concentration where the A/C interface 204 existed prior to the low temperature anneal, shown in FIG. 2A. The portion of the dopant species that was physically below the original A/C interface 204 has a concentration that is below the background concentration 202. Thus, an abrupt junction is formed with a depth that is approximately equal to the depth of the A/C interface 204.

Conventionally, additional high temperature anneals, e.g., 700° C.–1100° C., are performed to activate the remaining dopant species. However, if an additional high temperature anneal were to be performed, the abruptness of the junction will be reduced. Thus, the remaining processing of substrate 100 is performed with a thermal budget less than or equal to the temperature used in the low temperature anneal process to advantageously retain the abrupt shallow junction.

It should be understood that the A/C interface 204 can be located at any position along dopant profile 206. Thus, the junction depth can be made very shallow by using the appropriate energy for the implant of the inert ions. The background concentration 202, however, will ideally be greater than the active dopant profile 208 below A/C interface 204.

The shallow abrupt junction, as described above, may be used in diodes, transistors, including bipolar and metal oxide semiconductor field effect transistors (MOSFET), or any other device in which shallow junctions are desirable. For example, one application of the shallow abrupt pn junction is the formation of source and drain extensions in a MOSFET device as described in FIGS. 3A through 3D.

Figure 3A:
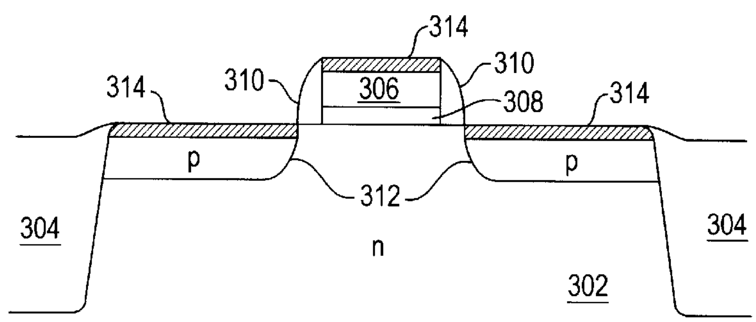
FIGS. 3A, 3B, 3C and 3D show the processing steps of forming an abrupt shallow pn junction as source and drain extensions in a MOSFET.

FIG. 3A shows a MOSFET structure 300 after a conventional salicide process but without drain extensions. Drain extensions are the shallowest junction in a MOSFET, and thus are the most difficult to form in an aggressively scaled device. MOSFET structure 300 includes an n-type silicon substrate 302 with shallow trench isolation regions 304, formed using a well known process. Of course, if desired, other types of isolation regions may be used. The n-type silicon substrate 302 is used to generate a PMOS transistor. It is understood, of course, that an NMOS transistor may be produced by using an appropriate doping scheme. MOSFET structure 300 also includes a gate electrode 306, e.g., polysilicon, overlying a gate dielectric 308, e.g., silicon oxide or silicon nitride. Sidewall spacers 310 are conventionally formed along gate electrode 306. Sidewall spacers 310, by way of an example, are approximately 1000 Å wide. However, it should be understood that the width of sidewall spacers 310 may vary if desired. Sidewall spacers 310, in accordance with an embodiment of the present invention, are sacrificial spacers and are preferably made out of a material that is different from gate dielectric 308. Thus, when gate dielectric 308 is silicon oxide, sidewall spacers 310 may be silicon nitride.

As shown in FIG. 3A, p-type source and drain regions 312 are formed aligned with sidewall spacers 310. Source and drain regions 312 are conventionally formed with a boron or $BF_2$ implant at an energy of approximately 20–30 keV, such as 25 keV, and a dosage of approximately $1–9\times10^{15}$ $cm^{-2}$, such as $5\times10^{15}$ $cm^{-2}$. The source and drain regions 312 are formed to a depth of approximately 100 nm to 200 nm. If substrate 302 is a p-type substrate, the source and drain regions 312 may be formed using an implant of phosphorous of approximately 10–20 keV, such as 15 keV, at a dosage of approximately $1\times10^{15}$ $cm^{-2}$. Arsenic may be implanted at a higher energy or a combination of phosphorous and arsenic may be used. It is understood that the concentration of the dopant implant in source and drain regions 312 is an important factor in determining the drive current of the device, and thus, by properly adjusting the energy and dosage of the dopant implant the desired depth and drive current may be obtained.

Figure 3B:
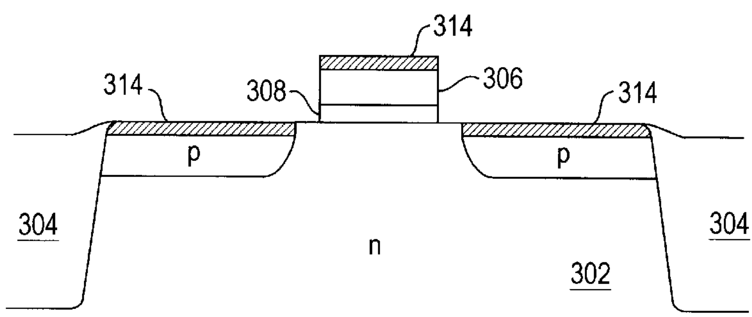

Silicide contacts 314, shown in FIG. 3A, are formed using a conventional salicide process (self-aligned silicide). Silicide contacts 314, by way of an example, may be formed with titanium or cobalt. The sidewall spacers 310 are then removed, e.g., wet etched, as shown in FIG. 3B.

Figure 3C:
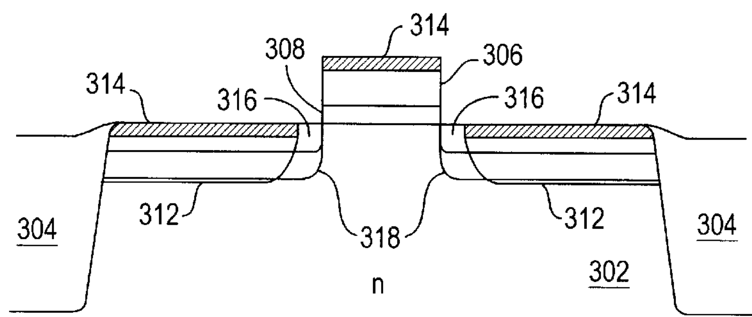
Figure 3D:
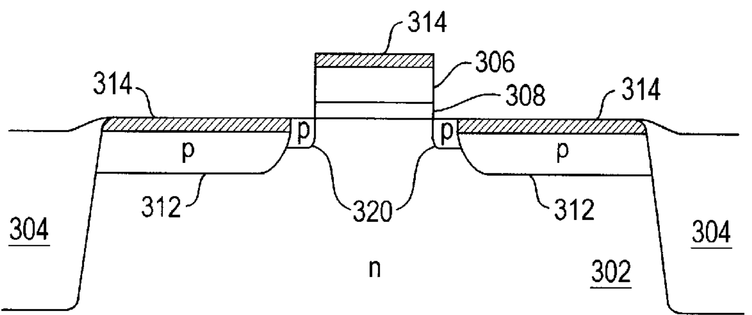

As shown in FIGS. 3C and 3D, source and drain extensions are formed using the method of forming abrupt shallow junctions as described above. As shown in FIG. 3C, an amorphous region 316 is formed. Because sidewall spacers 310 (FIG. 3A) have been removed, amorphous region 316 is aligned with gate electrode 306. As described above, an inert specie, such as germanium or silicon, is implanted into substrate 302 forming an amorphous/crystalline interface at the depth of the desired junction. By way of an example, germanium may be implanted at an energy of approximately 10–30 keV, such as 15 keV, with a dosage of approximately $10^{14}$ $cm^{-2}$ to form amorphous region 316 to a depth of approximately 10–50 nm.

Inactive p-type regions 318 are also formed in substrate 302 aligned with gate electrode 306, as shown in FIG. 3C. Inactive p-type regions 318 is formed with a boron or $BF_2$ implant with an energy of approximately 1–5 keV and a dosage of approximately $1–9\times10^{14}$ $cm^{-2}$, such as $5\times10^{14}$ $cm^{-2}$. Where substrate 302 is a p-type substrate, region 318 is formed with an n-type dopant, such as phosphorous or arsenic at an energy of 1–9 keV, the dosage of the phosphorous or arsenic being approximately $10^{14}$ $cm^{-2}$. Amorphous region 316 may be formed before or after the dopant implant used to form the inactive regions 318.

As described above in reference to FIGS. 1B and 1C and FIGS. 2A and 2B, a low temperature anneal is then performed at approximately 600° C. for approximately 50–70 seconds in a nitrogen atmosphere. The low temperature anneal recrystallizes amorphous region 316. As shown in FIG. 3D, the low temperature anneal will activate the dopant within amorphous region 316 (shown in FIG. 3C), thereby forming source and drain extensions 320.

The remaining steps in fabricating the MOSFET device may then be conducted pursuant to conventional processing methods. However, the remaining fabrication steps have a thermal budget of less than or equal to the temperature used in the low temperature anneal step, i.e., 600° C.

FIGS. 4A through 4D show the formation of source and drain extensions in a MOSFET device with the addition of a halo implant. The use of a halo implant follows the same process shown in FIGS. 3A through 3D, however with the addition of a halo implant preferably after removal of sidewall spacers 310. Thus, FIG. 4A follows the step shown in FIG. 3B.

Figure 4A:
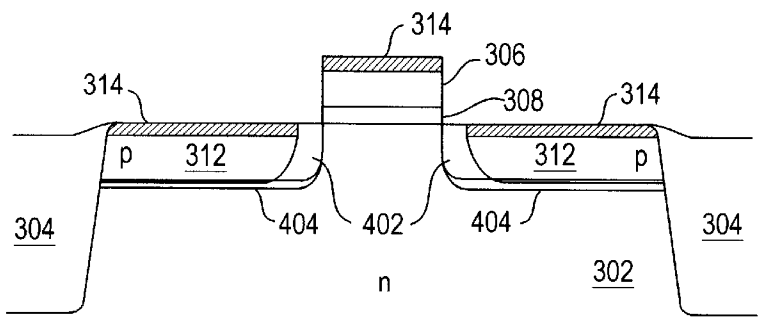
FIGS. 4A, 4B, 4C, and 4D show the processing steps of forming a halo implant along with an abrupt shallow pn junction as source and drain extensions in a MOSFET.
Figure 4B:
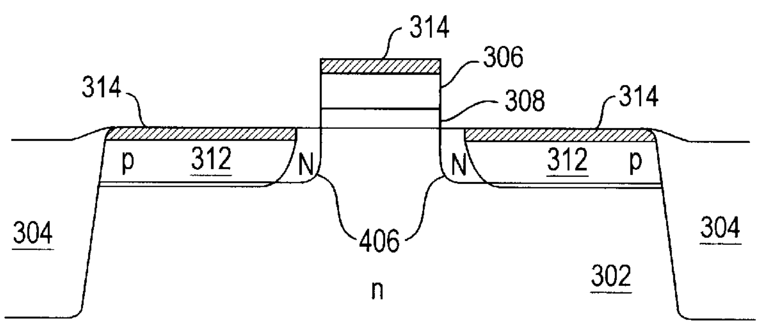

FIGS. 4A and 4B show the formation of the halo implant using the method of forming a shallow junction as described above. Accordingly, an n-type dopant is implanted into substrate 302 to form an inactive dopant region 402. Thus, for example, phosphorous or arsenic may be implanted at an appropriate energy and dosage to form an inactive dopant region 402 to a depth approximately equal to or less than the depth of source and drain regions 312. An amorphous region 404 is also formed in substrate 302 by implanting inert ions, such as germanium or silicon. Because the halo implant is not a shallow implant, the amorphous region 404 may be implanted deep enough to encompass the complete inactive dopant region 402, as shown in FIG. 4A. When amorphous region 404 is annealed all of inactive dopant region 402 will be activated forming n-type halo region 406, shown in FIG. 4B.

It should be understood that the halo implant may alternatively be conventionally formed, i.e., prior to the source and drain implantation, thereby avoiding the amorphizing implant. The advantage of the present amorphizing technique for halo implants is primarily in the elimination of diffusion of the species and thus confining the species at a desired distance particularly in the lateral direction.

Figure 4C:
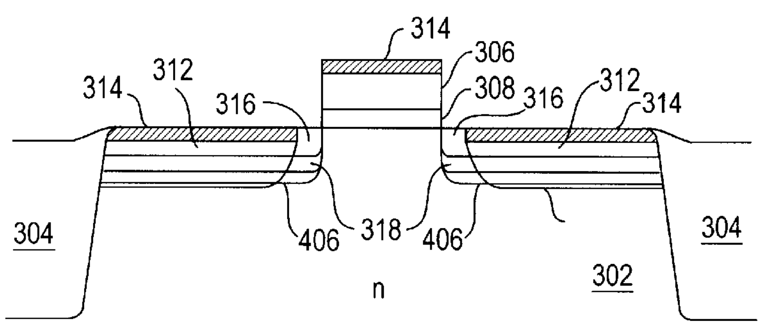
Figure 4D:
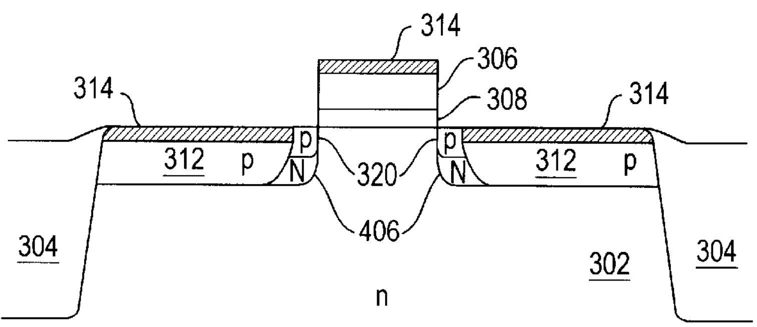

FIGS. 4C and 4D show the formation of source and drain extensions 320, as discussed in reference to FIGS. 3C and 3D. Consequently, as shown in FIG. 4D, source and drain extensions 320 are formed within n-type halo region 406.

Again, the remaining steps in fabricating the MOSFET device may then be conducted pursuant to conventional processing methods with a thermal budget of less than or equal to the temperature used in the low temperature anneal steps.

It should be understood, of course, that the above description of the formation of a PMOS transistor with shallow abrupt source and drain extension is illustrative and that an NMOS transistor may similarly be produced using the appropriate dopant types, as is well understood in the art. Further, the shallow abrupt junctions may be used in embodiments other than source and drain extensions in a MOSFET, for example, in an emitter junctions in a diode or bipolar transistor.

While the present invention has been described in connection with specific embodiments, one of ordinary skill in the art will recognize that various substitutions and modifications may be made after having reviewed the present disclosure. The specific embodiments described above are illustrative only. Other embodiments using the shallow abrupt junctions described above, include but are not limited to bipolar transistors, CMOS transistors, diodes, and any other application where a shallow abrupt junction is desirable, the formation of which will be understood by those of ordinary skill in the art in light of the present disclosure. Therefore, the spirit and scope of the appended claims should not be limited to the foregoing description.

What is claimed is:

1. A process of forming source and drain extensions in a semiconductor device, said process comprising:

providing a substrate with a background concentration of a first dopant species having a first conductivity type;

forming a gate dielectric and gate electrode on said substrate;

forming sidewall spacers aligned with said gate dielectric and gate electrode;

implanting source and drain regions aligned with said sidewall spacers;

annealing the implanted source and drain regions;

removing said sidewall spacers;

implanting said inert specie into said substrate to form an amorphous layer near the surface of said substrate after removing said sidewall spacers, said amorphous layer having a first depth;

implanting a second dopant species with a second conductivity type into said substrate to a second depth, wherein said second depth is greater than said first depth, wherein said first dopant species and said second dopant species have different conductivity types, the second dopant species having a high concentration near said surface of a said substrate; and annealing said substrate at a temperature sufficient to regrow said amorphous layer, wherein said second dopant specie within said amorphous layer is activated and forms said source and drain extensions with an abrupt junction at approximately said first depth, wherein said source and drain extensions are aligned with said gate dielectric and gate electrode;

wherein the thermal budget for subsequent processing steps of said substrate is approximately equal to or below said temperature sufficient to regrow said amorphous layer.

2. The process of claim 1, further comprising forming halo regions prior to forming said source and drain extensions, wherein forming halo regions comprises:

implanting a third dopant species with said first conductivity type into said substrate;

implanting a second inert specie into said substrate to form a second amorphous layer that encompasses the implanted third dopant specie; and annealing said substrate at a temperature sufficient to regrow said second amorphous layer, wherein said implanted third dopant specie within said second amorphous layer is activated and forms said halo regions.

3. A process of forming an abrupt junction in a semiconductor device, said process comprising:

providing a substrate with a background concentration of a first dopant species having a first conductivity type;

implanting an inert specie into said substrate to form an amorphous layer near the surface of said substrate, said amorphous layer having a first depth;

implanting a second dopant species with a second conductivity type into said substrate to a second depth, wherein said second depth is greater than said first depth, wherein said first dopant species and said second dopant species have different conductivity types, the second dopant species having a high concentration near said surface of said substrate, wherein implanting said second dopant species into said substrate occurs prior to implanting said inert species into said substrate to form an amorphous layer; and annealing said substrate at a temperature sufficient to regrow said amorphous layer, wherein said second dopant specie within said amorphous layer is activated and forms said abrupt junction at approximately said first depth;

wherein the thermal budget for subsequent processing steps of said substrate is approximately equal to or below said temperature sufficient to regrow said amorphous layer.

4. The process of claim 1, wherein between approximately said first depth and said second depth the active concentration of said second dopant species is less than the active background concentration of said first dopant species.

5. The process of claim 1, wherein said substrate is a single silicon crystal substrate, said inert species comprises germanium, and said second dopant species comprises boron.

6. A process of forming a junction, said process comprising:

providing a substrate, said substrate being a single crystal substrate with a background concentration of a dopant species of a first conductivity type;

generating an amorphous layer between the surface of said substrate and a first depth, wherein said first depth is approximately the desired depth of the junction;

doping said substrate with a dopant species of a second conductivity type, wherein the doped region extends to a second depth greater than said first depth, and wherein the peak concentration of said dopant species of a second conductivity type is located at least partially within said amorphous layer, wherein said generating an amorphous layer is performed after said doping said substrate with a dopant species of a second conductivity type; and annealing said substrate at a temperature sufficient to recrystallize said amorphous layer through solid phase epitaxy, wherein said dopant species of a second conductivity type within said amorphous layer is activated, said temperature being insufficient to completely activate said dopant species of a second conductivity type outside said amorphous layer thereby forming said junction at approximately said first depth;

wherein subsequent processing of said substrate occurs approximately at or below said temperature.

7. The process of claim 6, wherein said process forms source and drain extensions aligned with a gate electrode on a substrate, said process further comprising:

forming a gate electrode on said substrate;

implanting source and drain regions; and annealing the implanted source and drain regions;

wherein the activated dopant species of a second conductivity type forms said source and drain extensions.

8. The process of claim 6, wherein said generating an amorphous layer comprises implanting germanium or silicon ions into said substrate.

9. The process of claim 6, wherein said doping said substrate with a dopant species of a second conductivity type comprises implanting ions of said dopant species of a second conductivity type.

10. The process of claim 9, wherein said ions comprise boron, phosphorous, or arsenic.

11. The process of claim 6, wherein said doping said substrate with a dopant species of a second conductivity type forms an inactive doped region between approximately the surface of said substrate and said second depth.

12. The process of claim 11, wherein after said annealing said substrate at a temperature sufficient to recrystallize said amorphous layer, the concentration of said dopant species of a second conductivity type between said first depth and said second depth is less than the background concentration of said dopant species of a first conductivity type.

* * * * *